United States Patent
Tanaka

[11] Patent Number: 6,068,940
[45] Date of Patent: May 30, 2000

[54] MATERIAL FOR ORGANIC ELECTROLUMINESCENT DEVICE AND ORGANIC ELECTROLUMINESCENT DEVICE FABRICATED USING SAID MATERIAL

[75] Inventor: Taizou Tanaka, Tokyo, Japan

[73] Assignee: NEC Corporation, Tokyo, Japan

[21] Appl. No.: 09/082,794

[22] Filed: May 22, 1998

[30] Foreign Application Priority Data

May 30, 1997 [JP] Japan ................................ 9-141698

[51] Int. Cl.⁷ .................................................. H05B 33/14
[52] U.S. Cl. ........................ 428/690; 428/917; 428/691; 313/504
[58] Field of Search ................................. 428/690, 917, 428/691; 313/504

[56] References Cited

FOREIGN PATENT DOCUMENTS

| | | |
|---|---|---|
| 7-90259 | 4/1995 | Japan . |
| 7-126330 | 5/1995 | Japan . |
| 7-142169 | 6/1995 | Japan . |
| 7-166159 | 6/1995 | Japan . |
| 7-188340 | 7/1995 | Japan . |
| 7-288184 | 10/1995 | Japan . |
| 8-157815 | 6/1996 | Japan . |

OTHER PUBLICATIONS

Nishi et al., Dye and Chemical, 13, 81 (1968).

*Primary Examiner*—Charles Nold
*Attorney, Agent, or Firm*—Sughrue, Mion, Zinn, Macpeak & Seas, PLLC

[57] ABSTRACT

Described is an organic electroluminescent device material which comprises a coumarin derivative represented by the following formula (1):

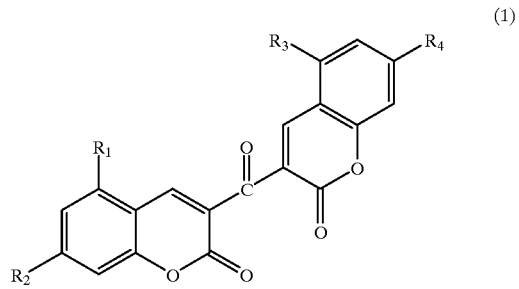

wherein $R_1$ to $R_4$ each independently represents a hydrogen atom, a halogen atom or a substituted or unsubstituted alkyl, alkoxy, thioalkyl, aryloxy, arylthio, carbocyclic aromatic or heterocyclic aromatic group; and an organic electroluminescent device fabricated using the material. According to the present invention, a red-emitting material with high brightness and high luminous efficiency indispensable for full color display can be provided.

6 Claims, 5 Drawing Sheets

MATERIAL FOR ORGANIC ELECTROLUMINESCENT DEVICE AND ORGANIC ELECTROLUMINESCENT DEVICE FABRICATED USING SAID MATERIAL

BACKGROUND OF THE INVENTION

1. Field of the Invention

This invention relates to a material for an organic electroluminescent device and an organic electroluminescent device fabricated using the material. More specifically, the present invention relates to an organic electroluminescent (which will hereinafter be abbreviated as "EL") material used for full color display and an organic EL device fabricated using the material.

2. Description of the Related Art

An organic EL device makes use of the phenomenon that holes injected from an anode and electrons injected from a cathode recombine in an emitter layer having a fluorescent capacity and radiates light at the time of deactivation from the excitation state. Researches on such a device have been started, paying attention to a high fluorescence quantum efficiency of an organic compound and its molecular structure permitting various designs. The luminescent brightness and efficiency of an organic compound was however insufficient for practical application. After that, Tang and Vanslyke reported that by the use of, instead of an emitter layer alone, a stacked structure in which the emitter layer is combined with a material having excellent hole transporting capacity (which will hereinafter be called "hole transport layer") brings about a drastic improvement in the performance of the device (Applied Physics Letter, 51, 913 (1987)). With that report as an opportunity, the study has been concentrated to the technique of completely and functionally dividing the layer into a layer having a role of injecting holes (hole injection layer), a layer having a role of transporting electrons (electron transport layer) and the like. Owing to an improvement in the performance of each organic material in addition to the above-described progress in the study, an organic EL material is near industrialization as a display device (an emitter Layer, electron transport layer, hole transport layer and hole injection layer will hereinafter be called an "organic functional layer" collectively).

Figure 2:
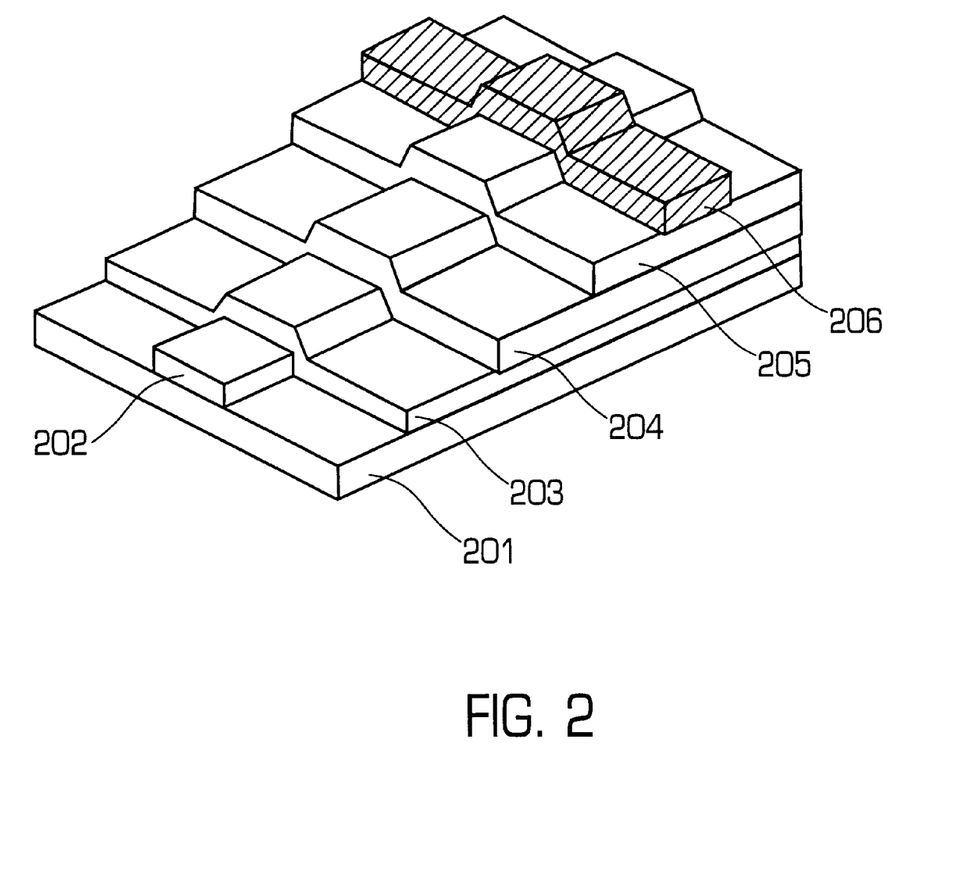
FIG. 2 is a perspective view illustrating the structure of the conventional red-color luminescent EL device.

Recently, it has been reported that in the case of a green luminescent type, the use of a starburst amine for a hole injection layer brings about a brightness of at least 100 thousand $cd/m^2$, a luminous efficiency of at least 101 m/W ("Monthly Display", September, 1995) and a half life of the brightness of at least 10 thousand hours when continuously driven. As an organic EL device assuming blue luminescence, it has been reported (in the special lecture at the 70th Spring Annual Meeting of The Chemical Society of Japan) that the use of a distyrylarylene derivative as a luminescent material brought about a brightness of at least 20 thousand $cd/m^2$, a luminous efficiency of 51 m/W and a half life of at least 5000 hours. The study on a red luminescent material however has not yet reached a practically usable level, because an organic compound originally has a band gap wider than that of an inorganic semiconductor material so that molecular designing cannot be effected easily, a substance synthesized from it has difficulty in the film formation and an yield of purification conducted for purity increase is poor. Under such circumstances, as disclosed in Japanese Patent Laid-Open No. 152897/1991, an attempt has been made as a method to attain red or multi-color emission. In the method, a filter called "a color changing layer" is inserted in front of an organic EL device and this filter has an absorption in the luminescent wavelength from the organic EL device and at the same time emits fluorescence. At the time when a light emitted from the EL device passes through the filter, a portion of it changes in color and is taken out as red or multi-color luminescence. The above-described method is however accompanied with the drawbacks that since a quantum efficiency is limited because of a color change of a light emitted from EL through a filter, sufficient luminous efficiency cannot be attained and the use of a filter inevitably increases the cost. Disclosed examples of the EL material assuming red luminescence include (1) phthalocyanine compound, as described in Japanese Patent Laid-Open No. 288184/1995, represented by the following formula:

wherein X represents a hydrogen atom; M is selected from the group consisting of magnesium, lithium, sodium, calcium, zinc, aluminum, gallium and indium; and in $(Y)_B$, B stands for 0 or 1 and when B stands for 1, Y is selected from the group consisting of chorine and bromine;

(2) a 4-hydroxyacridine compound, as described in Japanese Patent Laid-Open No. 166159/1995, represented by the following formula:

-continued wherein M stands for a metal in Groups II–III of the periodic table;

(3) a violanthrone compound, as disclosed in Japanese Patent Laid-Open No. 90259/1995, which is represented by the following formula:

wherein $R_1$, $R_2$, $R_3$, R4, $R_5$ and R6 each independently represents a hydrogen atom, a halogen atom, a lower alkyl group, a lower alkoxy group, a phenyl group, a dialkcylamirno group or a diphenylamino group. The structure of a red-emitting device fabricated using such a material will next be described with reference to FIG. 2. Over a transparent insulation supporting substrate (201), a transparent conductive thin-film (202) is stacked as an anode. Then, a hole transport layer (203), the above-described red-emitting layer (204) and an electron transport layer (205) are stacked successively over the thin film, followed by the formation of an upper cathode layer (206). The red-emitting layer (204) is poor in the injection and transporting capacities of holes and electrons so that an efficiency increase can be attained by sandwiching the red-emitting layer between the hole transport layer and electron transport layer. The above-described red-emitting material however cannot be put into practical use because its fluorescence quantum efficiency is low and it can emit light with a brightness of only about 1000 cd/m$^2$ even if the amount of a current flowing through the device is increased.

Using examples of a coumarin derivative for attaining blue to white light emission for full-color display include (4) Japanese Patent Laid-Open No. 157815/1996, (5) Japanese Patent Laid-Open No. 126330/1995, and (6) a mixed material, as disclosed in Japanese Patent Laid-Open No. 188340/1995, of a coumarin derivative and a compound having a specific structure represented by the following formulas:

wherein $R_1$ to $R_5$ each independently represents an atom or group selected from a hydrogen atom, a fluorine atom and alkyl, alkoxy, dialkylamino, alkanoyloxy, alkyloxycarbonyl, aryl, cyano, alkanoyl and trifluoromethyl groups, X represents O or NY, in which Y representing a hydrogen atom, an alkyl group or an aryl group, n stands for 0, 1 or 2 and $R_6$ represents a hydrogen atom or a methyl group. When such an organic material is used as an emitter layer, stable blue light emission can be attained and furthermore, it becomes possible to emit a white light by mixing it with green- and red-dopant materials.

In the above-described prior art, the first problem resides in that in the case where the above coumarin derivative emits blue light and multi-color or red color emission is aimed at, another red-emitting material is necessary. In this case, the material for red light emission as described above in (1) Japanese Patent Laid-Open No. 288184/1995, (3) Japanese Patent Laid-Open No. 90259/1995 or (2) Japanese Patent Laid-Open No. 166159/1995; or the material which is described in (4) Japanese Patent Laid-Open No. 157815/1996 and has a structure represented by the following formula:

is used.

Even if any one of the red-emitting materials is used, sufficient brightness cannot be attained so that an attempt for multicolor light emission inevitably lowers a color balance.

The second problem resides in the film forming property. The above-described coumarin derivative is a high molecule having a molecular weight of about 500,000 so that resistance heating type vacuum deposition, which is an ordinarily employed film formation method, cannot be employed for it. Instead, it is inevitable to adopt a spin coating method after dissolving the derivative in an organic solvent such as toluene or acetone. When the solution so obtained is coated at a rotational speed of 6000 rpm, the homogeneity of the thin film thus obtained is inferior by several % to several ten % to that of the film formed by the vacuum deposition method. Moreover, defects as large as several microns presumably occur in the film, which becomes a cause for shortening the life of the organic EL device.

SUMMARY OF THE INVENTION

An object of the present invention is therefore to F) provide a coumarin derivative which has a structure different from that of the conventional coumarin derivative and therefore can not only overcome the above-described technical problems in multi-color emission but also directly emit orange to red light with high brightness and high efficiency, thereby achieving full-color emission by the use of an organic EL device.

In order to overcome the above-described problems, the present invention provides the following means:

1. An organic EL material comprising a coumarin derivative represented by the following formula (1):

wherein $R_1$ to $R_4$ each independently represents a hydrogen atom, a halogen atom, a substituted or unsubstituted alkyl group, a substituted or unsubstituted alkoxy group, a substituted or unsubstituted thioalkyl group, a substituted or unsubstituted aryloxy group, a substituted or unsubstituted arylthio group, a substituted or unsubstituted carbocyclic aromatic group or a substituted or unsubstituted heterocyclic aromatic group.

2. An organic EL device having an organic functional layer, which includes at least one emitter layer, sandwiched between a pair of electrodes, wherein materials forming said organic functional layer comprises an organic EL material as described above in 1.

3. An organic EL device as described above in 2, wherein said emitter layer comprises an organic EL material represented by the formula (1).

4. An organic EL device as described above in 3, wherein said emitter layer comprises a green-light emitting material having an EL spectrum at 500 nm to 550 nm and an organic EL material represented by the formula (1).

5. An organic EL device as described above in 3, wherein said emitter layer comprises a quinoline metal complex and an organic EL material represented by the formula (I).

6. An organic EL device as described above in 5, wherein the organic EL material represented by the formula (1) is contained in an amount of 0.001 to 50 wt. % relative to the quinoline metal complex.

The first effect brought by the use of the luminescent material of the present invention is that it becomes possible to emit a long wave-length light from orange to red, which is indispensable for the materialization of full color display by an organic EL device, with high brightness and high efficiency, because the luminescent material used in the present invention has absorption in a green-color range (480 to 550 nm) and shows fluorescence at high quantum efficiency in a range from orange to red color. The second effect is that the use of the material according to the present invention makes it possible to achieve an ultra-long life of the EL device, because the material of the present invention existing in a trace amount as a doping material permits a color change from orange to red and such a slight existence does not disturb carriers from moving inside of the EL device so that the device is able to have a life as long as the conventional green light emitting device. The EL device fabricated using the material of the present invention is therefore expected to be used effectively as a luminescent device for various full color display applications.

DETAILED DESCRIPTION OF THE PREFERRED EMBODIMENTS

Specific examples of the coumarin derivative usable in the present invention are shown in Table 1.

TABLE 1

| Comp'd No. | Structural formula |
|---|---|
| No. 1 | (bis-coumarin-3-yl ketone) |
| No. 2 | (bis(5,7-dimethylcoumarin-3-yl) ketone) |
| No. 3 | (bis(5,7-diethylcoumarin-3-yl) ketone) |
| No. 4 | (bis(5,7-dimethoxycoumarin-3-yl) ketone) |
| No. 5 | (bis(7-(4-fluorocyclohexyl)coumarin-3-yl) ketone) |

TABLE 1-continued

| Comp'd No. | Structural formula |
|---|---|
| No. 6 | (structure: bis-coumarin with CF$_3$ and F substituents, linked by C=O) |
| No. 7 | (structure: bis-coumarin with OCH$_2$CF$_2$ substituents, linked by C=O) |
| No. 8 | (structure: bis-coumarin with CF$_3$ substituents, linked by C=O) |
| No. 9 | (structure: bis-coumarin with fluorophenyl and trifluorophenyl substituents, linked by C=O) |
| No. 10 | (structure: bis-coumarin with Cl substituents, linked by C=O) |

TABLE 1-continued

| Comp'd No. | Structural formula |
|---|---|
| No. 11 | |
| No. 12 | |
| No. 13 | |
| No. 14 | |

TABLE 1-continued

| Comp'd No. | Structural formula |
|---|---|
| No. 15 |  |

The first feature of the organic EL device fabricated using the organic material of the present invention resides in that red color emission with high brightness and high efficiency can be attained because the fluorescence quantum efficiency is higher than that of the conventional red-emitting material under a thin-film condition. The second feature of the present invention resides in that the life of the organic EL device can be elongated easily by the use of an organic material.

Phenomena such as deterioration in brightness or lowering in luminous efficiency occur when an organic EL device is driven. Deterioration in adhesion on an organic layer/organic layer interface and local concentrator of an electric field due to the lack of homogeneity of the organic layer are presumed to affect largely on such phenomena. When a film is formed on a 30 cm×30 cm glass substrate by using the organic material of the present invention through vacuum deposition, in-plane uniformity within a scattering range of 3% can be maintained. In addition, no defects such as foreign matters are generated even when observed through AFM (atomic force microscope) so that deterioration due to the concentration of an electric fields is not found.

Figure 3:
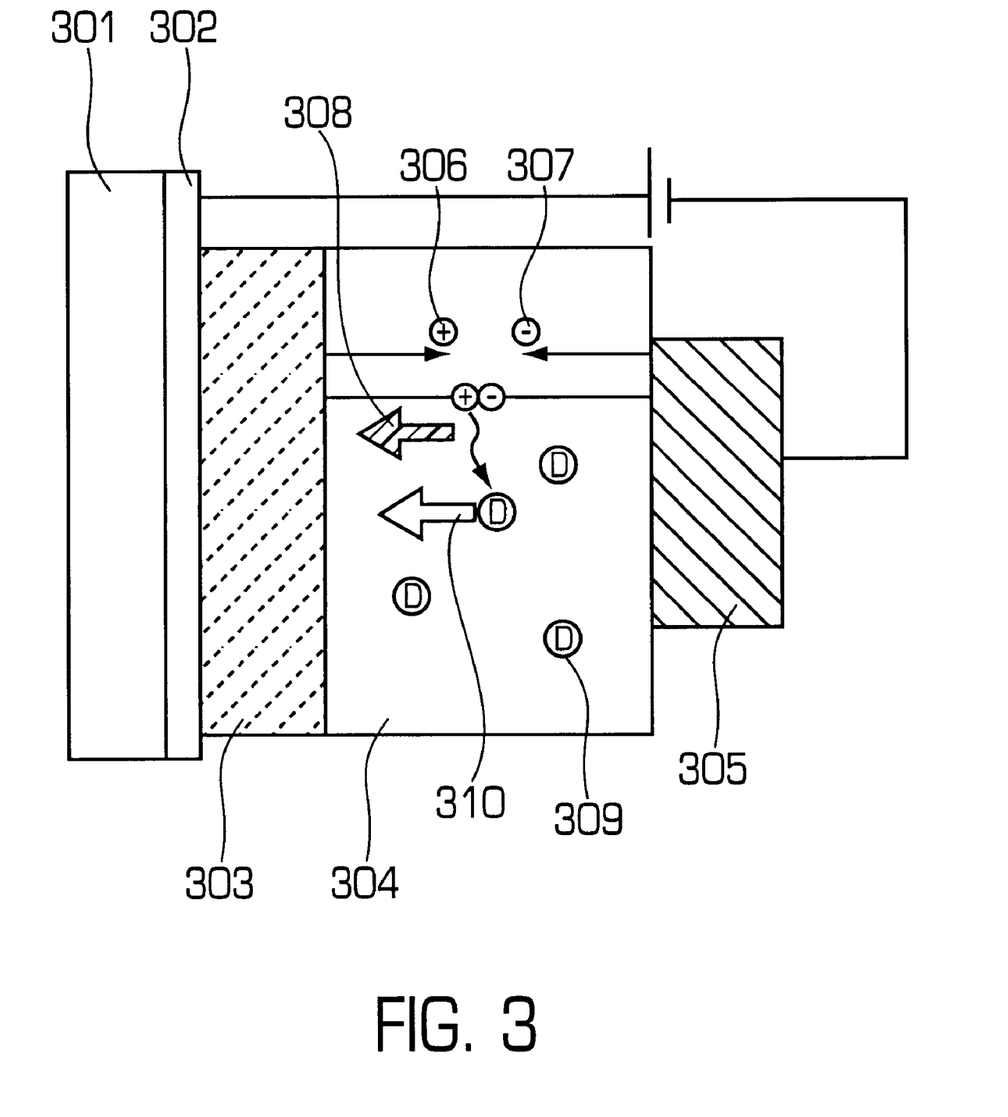
FIG. 3 is a schematic cross-sectional view of an EL device which illustrates the principle of a color change.

The third feature of the present invention resides in that the organic material acts also as a doping material. This phenomenon will next be described more specifically with reference to FIG. 3. When an electric field is applied to an organic EL device, carriers, that is, an electron 307 and a hole 306 are injected inside of the device. These carriers both transfer inside of the organic layer and recombine in the luminescent material (host material) 308 in the emitter layer. In addition, when the dopant material 309 exists in the vicinity of the recombined region and at the same time, an absorption spectrum of the dopant material overlaps with the exciting energy of the luminescent material, energy transfer occurs 310, which enables color change.

The above-described effect is not sufficient in the case of the conventional red-emitting material, because a low fluorescence quantum yield disturbs complete color change and inclusion of some luminescence from the emitter layer (host) deteriorates the color purity. The coumarin derivative used in the present invention, on the other hand, is suited also as a doping material because it has a high fluorescence quantum yield and has maximum absorption at 500 nm or so. In other words, in the presence of an emitter layer (host) having stable green luminescence, a color change into red luminescence can be carried out easily.

An organic EL device fabricated using a red luminescent material of the present invention has various embodiments. Basically, it is only necessary to have an emitter layer sandwiched between a pair of electrodes (anode and cathode) and, if necessary, to insert a hole transport layer and electron transport layer to between these electrodes. Specific examples of the structure include (1) anode/emitter layer/cathode, (2) anode/hole transport layer/emitter layer/cathode, (3) anode/hole transport layer/electron transport layer/cathode, (4) anode/hole injection layer/hole transport layer/emitter layer/enitter layer/cathode, (5) anode/hole injection layer/hole transport layer/emitter layer/electron transport layer/cathode and (6) anode/hole injection layer/emitter layer/electron injection layer/cathode. The devices having the above-described structures are each preferably supported on a substrate. No particular limitation is imposed on the substrate and those ordinarily used for an organic EL device, for example, substrates made of glass, transparent plastic, or quartz can be employed.

Figure 1:
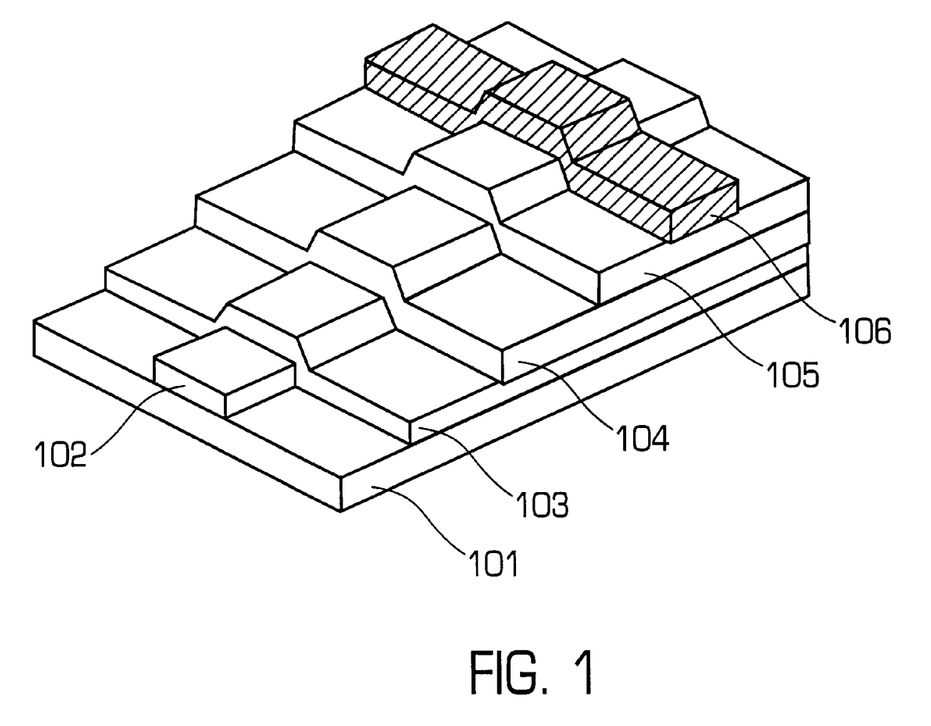
FIG. 1 is a perspective view illustrating one embodiment of the present invention.

Based on the above-described structure (3), the embodiment of the present invention will next be described in detail with reference to FIG. 1. As the anode 102 formed on the supporting substrate 101, a metal, alloy or conductive compound or a mixture thereof having a higher work function (at least 4.1 eV) is preferably used. Examples of such an electrode material include ferroelectric transparent materials such as ITO, $SnO_2$ and ZnO. Such an electrode material is formed into a thin film by deposition, sputtering or the like, whereby the anode 102 is formed. When luminescence is taken out from the electrode, it is desired to set a transmittance at greater than 50% and to set a sheet resistance at several hundred $\Omega/\square$ or less. Its film thickness is selected generally from a range of 10 nm to 1 μm, preferably from a range of 10 nm to 200 nm. For heightening an efficiency to take out luminescence from an EL device, it is convenient that either one of the anode 102 or cathode is transparent or semi-transparent.

As the hole injection layer 103 to be formed in the next place, a compound which permits the injection of holes from the anode, being disposed between two electrodes to which an electric field has been applied, and at the same time, has good adhesion with the anode is selected. Described specifically, the hole injection layer is required to have an ionization potential of about 4.9 eV to 6.0 eV which is an intermediate value between that of the anode 102 and that of the hole transport layer 104, and have adhesion with the anode 102 as high as about 1300 gf/24 mm at which it does not peel off by a tape at room temperature as a result of the cross-cut adhesion test (JIS Z1522). Specific examples of the material include phthalocyanine derivative, triamine derivative, para-(9-anthryl)-N,N-di-para-tolylaniline (as described in Japanese Patent Laid-Open No. 111485/1991) and tetramethyl-bis(4-di-p-tolylaminophenyl)-p-xylene (as described in Japanese Patent Laid-Open No. 269084/1991).

As a compound used for the hole transport layer 104, materials which can transport holes to the emitter layer 105 properly and have a hole mobility of at least $10^{-6}$ cm$^2$/V·sec when an electric field of $10^4$ to $10^6$ V/cm is applied are preferred. No particular limitation is imposed on such a material insofar as it has the above-described performances and it is selected from electrophotographic materials which are ordinarily used as the conventional hole conducting material or materials publicly known as the hole transporting material for an EL device. Specific examples include triazole derivatives (as described in U.S. Pat. No. 3,112,197), oxadiazolederivatives (as described in U.S. Pat. No. 3,189,447), imidazole derivatives (as described in Japanese Patent Publication No. 16096/1962), polyarylalkane derivatives (as described in U.S. Pat. Nos. 3,615,402, 3,820,989 and 3,542,544; Japanese Patents Laid-Open Nos. 555/1970, 10983/1976, 17105/1976, 4148/1981, 108667/1980, 156953/1980 and 36656/1981), pyrazoline derivatives and pyrazolone derivatives (as described in U.S. Pat. Nos. 3,180,729 and 4,278,746, Japanese Patents Laid-Open Nos. 88064/1980, 88065/1980, 105537/1974, 51086/1980, 80051/1981, 88141/1981, 45545/1982, 112637/1979 and 74546/1980), plienylenediamine derivatives (as described in U.S. Pat. No. 3,615,404, Japanese Patent Publications Nos. 10105/1976, 3712/1971 and 25336/1972, Japanese Patent Laid-Open Nos. 53435/1979, 110536/1979 and 119925/1979), arylamine derivatives (as described in U.S. Pat. Nos. 3,567,450, 3,180,703, 3,240,597, 3,658,520, 4,232,103, 4,175,961 and 4,012,376, Japanese Patent Publications Nos. 35702/1974, 27577/1964, 144250/1980, 119132/1981 and 224347/1981 and German Patent No. 1,110,518), amino-substituted chalcone derivatives (as described in U.S. Pat. No. 3,526,501), oxazole derivatives (as described in U.S. Pat. No. 3,257,203), styrylanthracene derivatives (as described in Japanese Patent Laid-Open No. 46234/1981), fluorenone derivatives (as described in Japanese Patent Laid-Open No. 110837/1979), hydrazone derivatives (as described in U.S. Pat. No. 3,717,462, Japanese Patent Laid-Open Nos. 59143/1979, 52063/1980, 52064/1980, 46760/1980, 11350/1982 and 148749/1982), stilbene derivatives (as described in Japanese Patent Laid-Open Nos. 210363/1986, 228451/1986, 14642/1986, 72255/1986, 47646/1987, 36674/1987, 10652/1987, 30255/1987, 93445/1985, 94462/1985, 174749/1985 and 175052/1985), porphyrin compounds (as described in Japanese Patent Laid-Open No. 295695/1988) and aromatic tertiary amine compounds and styrylamine compounds (as described in U.S. Pat. No. 4,127,412, Japanese Patent laid-Open Nos. 27033/1978, 58445/1979, 149634/1979, 64299/1979, 79450/1980, 144250/1980, 119132/1981, 295558/1986, 98353/1986 and 29695/1988).

The coumarin derivative of the present invention which is represented by the formula (1) and is used as a luminescent material can be synthesized by reacting a salicylaldehyde derivative corresponding to the target coumarin derivative with piperidine; by nitrating and reducing a salicylaldehyde derivative in a manner known per se in the art and then introducing a specific substituent [ex. Nishi et al., Dye and Chemical, 13, 81(1968)]; or the like, but the synthesis process is not limited thereto. In the above reaction, it is preferred to use a solvent. Specific examples include benzene, toluene, xylene, anisole, chloroform, carbon tetrachloride, N,N'-dimethylformamide, N-methyl-2-pyrrolidone, N,N'-dimethylacetamide, N,N'-dimethylsulfoxide, petroleum ether, ligroin, hexane, heptane, cyclohexane and dioxane. The emitter layer 105 is a place where recombination of holes injected from the hole transport layer 104 and electrons injected from the cathode 106 occurs. To permit recombination of such carriers as much as possible, impurities which will be a carrier trap in its structure should not be contained. In order to make the derivative free from impurities, it is necessary to heighten the purity of the crude product synthesized by the above method to at least 99% by recrystallization or train sublimation. When the sublimation point is higher than the melting point of the material, recrystallization is recommended.

As the cathode 106, a metal, alloy or conductive compound or a mixture thereof which has a low work function (4 eV or lower) can be used as an electrode substance. Specific examples of such an electrode material include sodium, sodium-potassium alloy, magnesium, lithium, magnesium-indium alloy, lanthanoid series substances such as samarium, and aluminum-lithium alloy. Such an electrode material is formed into a thin film by deposition, sputtering or the like, whereby the cathode 106 is formed. The anode is preferred to have a sheet resistance, as an electrode, of several hundred Ω/mm or less and its thickness is selected generally from a range of 10 nm to 1 μm, preferably from a range of 50 to 200 nm. The cathode 106 may have thereon a functional layer, such as blocking layer or protective layer, which plays a role of blocking water and/or oxygen in the atmosphere.

A description will next be made of a method for the formation of an emitter layer. Various methods can be employed as a means for the formation of a thin film, but it is preferred to employ the deposition method, more specifically, a method of forming a thin film by deposition from a vapor phase, thereby forming a uniform and dense thin-film structure.

Figure 4:
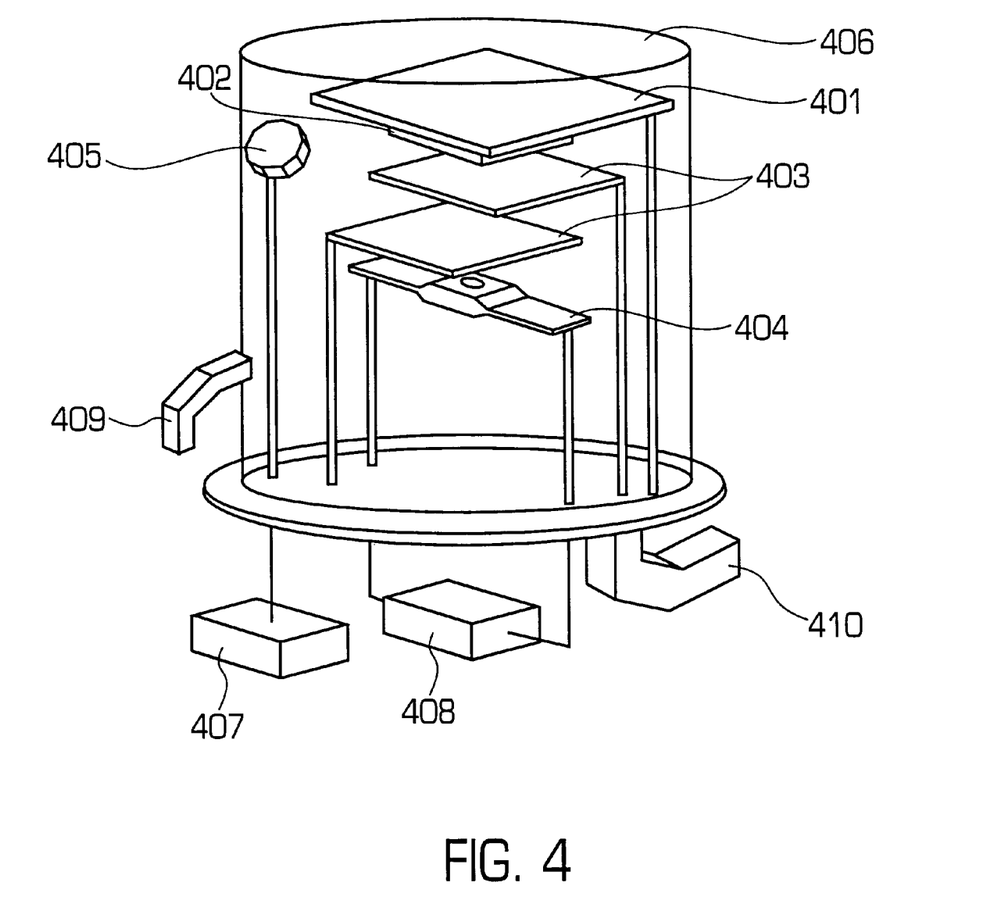
FIG. 4 is a schematic view illustrating one constitution example of an apparatus for the fabrication of the device of the present invention.

FIG. 4 illustrates one example of a film forming apparatus for the formation of an organic layer by using the deposition method. The film forming apparatus has a substrate holder 401 for holding a substrate 402, a deposition source 404, a shutter 403 and a quartz oscillator 405, all disposed in a bell-jar 406. The deposition source 404 is connected with a power source 408 whose electric current can be controlled by a film forming controller 407 and this mechanism makes it possible to provide a desired deposition rate and deposition film thickness with good reproducibility. Upon practical film formation, the pressure in the bell-jar 406 is reduced to $10^{-3}$ Pa or lower, followed by heating by using the deposition source 404 until the vapor pressure of the compound shows a sufficient increase. When the deposition rate reaches the intended value, the shutter 403 above the deposition source 404 is opened and deposition is effected. As soon as the film thickness reaches the intended value, the shutter 403 is closed and formation is finished. The above series of steps is generally employed for the formation of an organic film. It is applied to not only an emitter layer but also to a hole transport layer, cathode, hole injection layer and electron transport layer.

According to the first embodiment of the present invention, a single emitter layer is formed. In a crucible processed with molybdenum, high-purity graphite, BN or the like, 1 mg to 10 g of the material is weighed and placed, followed by the film formation by the above-described method. Here, it is most suited to set the deposition rate at about 0.05 to 1.5 nm/sec and film thickness to 100 nm or less in order to obtain a dense deposition structure.

As the second embodiment, the luminescent material according to the present invention is used as a hole transport layer and hole injection layer. The film forming method, film thickness and film forming rate are similar to those of the above embodiment, but the material for an emitter layer can be selected from a wide range from blue to red color.

Specific examples include aromatic compounds such as tetraphenylbutadiene (as described in Japanese Patent Laid-Open No. 51781/1982), metal complexes such as 8-hydroxyquinoline (as described in Japanese Patent Laid-Open No. 194393/1984 and U.S. Pat. Nos. 5,151,629 and 5,141,671), cyclopentadiene derivatives (as described in Japanese Patent Laid-Open No. 289675/1990), perinone derivatives (as described in Japanese Patent Laid-Open No. 28976/1990), oxadiazole derivatives (as described in Japanese Patent Laid-Open No. 216791/1990), bisstyrylbenzene derivatives (as described in Japanese Patent Laid-Open No. 245087/1989), perylene derivatives (as described in Japanese Patent Laid-Open No. 289890/1990), rare earth complexes (Japanese Patent Laid-Open No. 25684/1989), distyrylpyrazine derivatives (as described in Japanese Patent Laid-Open No. 256584/1990), p-phenylene compounds (as described in Japanese Patent Laid-Open No. 33183/1991), thiadiazolopyridine derivatives (as described in Japanese Patent Laid-Open No. 37292/1991), pyrrolopyridine derivatives (as described in Japanese Patent Laid-Open No. 37293/1991) and naphthyridine derivatives (as described in Japanese Patent Laid-Open No. 203982/1991).

According to the third embodiment of the present invention, the red luminescent material of the present invention is used as a mixed film with another luminescent material. As the another luminescent material, any one of the above-described luminescent materials can be used as is but materials having luminescence in a wavelength range of the absorption spectrum which the material of the present invention has. More specifically, materials having luminescence in the vicinity of 500 nm, for example, a metal complex of 8-hydroquinoline, are most suitable. The mixed ratio relative to the luminescent host material, which is a doping material, is about 0.001% to 50% and this value is most suited for allowing the device to exhibit its performance. When the concentration exceeds the above range, the doping material serves as a material of disturbing the transport of carriers, which lowers the efficiency. When the concentration is smaller than the above range, on the other hand, energy transfer cannot be carried out sufficiently, which also deteriorates the efficiency. Upon film formation, it is most suited to deposit the material and another material separately from two deposition sources. The concentration of the material used in the present invention is most preferably 0.1 mol % to 10 mol % relative to the another luminescent material in order to attain well-balanced recombination. The present invention will next be described based on synthesis examples and examples.

EXAMPLES

Synthetic Example: Synthesis of Compound No. 4

DMF (50 ml) was maintained at 20 to 30° C. over an ice bath and while stirring, $POCl_3$ (25 g) was added dropwise to it. The resulting mixture was stirred at room temperature for 15 minutes. To the mixture, a solution, which had been obtained by dissolving 4,6-dimethoxysalicylaldehyde (20 g) in the minimum amount of DMF, was added dropwise in portions while stirring at the liquid temperature maintained at 20 to 30° C. The reaction mixture was then stirred at room temperature for 30 minutes. A salicylaldehyde derivative (3 g) thus synthesized were weighed and dissolved in 1 mole of dimethyl-1,3-acetone dicarboxylate and 20 ml of a heated 50:50 mixture of alcohol and acetonitrile. After the addition of 2 to 4 ml of piperidine to the resulting solution and heating, the reaction mixture was refluxed over a steam bath for 2 hours. After the completion of the reaction, the reaction mixture was allowed to cool down, whereby a synthetic substance was obtained. The crude product so synthesized was recrystallized from an acetonitrile-pyridine mixture four times. As a result of elemental analysis of the compound so purified (Table 2), it has been confirmed that the target compound was formed.

TABLE 2

|   | Analytical results | Calculated |
|---|---|---|
| C | 4.16 | 4.11 |
| H | 63.28 | 63.30 |
| N | — | — |

Example 1

An ITO-coated white glass plate (product of HOYA Corporation) was cleaned with pure water and isopropyl alcohol in a ultrasonic washer for about 40 minutes, followed by drying over boiled isopropyl alcohol. The substrate was cleaned further in an UV ozone washer for 10 minutes and attached to a substrate holder of a vacuum deposition chamber. On the other hand, in a crucible made of high-purity graphite, 1 g of Compound No. 4, that is, a luminescent material was charged. After a current-carrying terminal was attached to the crucible, the vacuum chamber was evacuated to $2 \times 10^{-4}$ Pa. The crucible having the luminescent material therein was energized and deposition was effected at a deposition rate of 0.2 to 0.3 nm/sec until the film thickness reached 60 nm. The pressure of the vacuum chamber was returned to the atmospheric pressure and a stainless-made deposition mask was attached to the upper part of the supporting substrate/ITO/No. 4 layer. Aluminum (3 g) was placed in a BN-made boat, to which a current-carrying terminal was attached. Similarly, 1 g of Li was placed in a tungsten-made filament, to which another current-carrying terminal was attached. After the vacuum chamber was evacuated to $1 \times 10^{-4}$ Pa, the boat was energized so that the deposition rate of aluminum would be 0.2 nm/sec and at the same time, the filament was energized using another deposition source so that the deposition rate of lithium would be 0.02 nm/sec. After the deposition rate of each of the materials became stable, a shutter was opened. When the thickness of a mixed film reaches 20 nm, the power supply for the deposition of lithium was terminated, while an aluminum film was formed until the film thickness reached 170 nm. The pressure of the vacuum chamber was returned to the atmospheric pressure and an El, device having a composition of supporting substrate/ITO/No. 4 Compound/AlLi/Al was fabricated. When a voltage of 8 V was applied with the ITO of the device as a positive electrode and with the aluminum electrode as a negative electrode, an electric current of 10 $mA/cm^2$ flew through the device and red color emission having a brightness of 300 $cd/in^2$ was obtained. Luminous efficiency at that time was 1.1 lumen/watt (1 m/W). After storage of the resulting device for 5000 hours in the atmosphere, the area of the non-luminous portion was observed, resulting in that the area ratio of the non-luminous portion to the luminous portion was about 9%.

Example 2

In a similar manner to Example 1 except that Compound No. 5 was employed as an emitter layer instead of Compound No. 4, an EL device composed of a supporting substrate, ITO, Compound No. 5, AlLi and Al was fabricated. A voltage of 10V was applied with ITO as a positive electrode and the aluminum electrode as a negative electrode, a current density of 10 mA/cm$^2$ flew through the device and red luminescence having a brightness of 150 cd/m$^2$ was obtained. After the storage of the resulting device in the atmosphere for 5000 hours, an area of the non-luminescent portion was measured, resulting in that the area ratio of the non-luminescent portion to the luminescent portion was about 5%.

Example 3

In a similar manner to Example 1 except that Compound No. 11 was employed as an emitter layer instead of Compound No. 4, an EL device formed of a supporting substrate, ITO, Compound No. 11, AlLi and Al was fabricated. A voltage of 7 V was applied with ITO as a positive electrode and the aluminum electrode as a negative electrode, a current density of 12 mA/cm$^2$ flew through the device and red luminescence having a brightness of 450 cd/m$^2$ was obtained. After the storage of the resulting device in the atmosphere for 5000 hours, an area of the non-luminous portion was measured, resulting in that the area ratio of the non-luminous portion to the luminous portion was about 12%.

Example 4

In a similar manner to Example 1 except that Compound No. 14 was employed as an emitter layer instead of Compound No. 4, an EL device composed of a supporting substrate, ITO, Compound No. 14, AlLi and Al was fabricated. A voltage of 15 V was applied with ITO as a positive electrode and the aluminum electrode as a negative electrode, a current density of 10 mA/cm$^2$ flew through the device and red luminescence having a brightness of 100 cd/m$^2$ was obtained. After the storage of the resulting device in the atmosphere for 5000 hours, an area of the non-luminous portion was measured, resulting in that the area ratio of the non-luminous portion to the luminous portion was about 7%.

Example 5

In a similar manner to Example 1 except that Compound No. 9 was employed as an emitter layer instead of Compound No. 4, an EL device composed of a supporting substrate, ITO, Compound No. 9, AlLi and Al was fabricated. A voltage of 10 V was applied with ITO as a positive electrode and the aluminum electrode as a negative electrode, a current density of 25 mA/cm$^2$ flew through the device and red luminescence having a brightness of 800 cd/m$^2$ was obtained. After the storage of the resulting device in the atmosphere for 5000 hours, an area of the non-luminous portion was measured, resulting in that the area ratio of the non-luminous portion to the luminous portion was about 16%.

Example 6

After an ITO-coated white glass substrate prepared in a similar manner to Example 1 was installed to a deposition chamber, 1 g of Compound No. 4, which had been described above in Synthesis Example, was placed in a crucible made of high-purity graphite as an emitter layer. In another crucible, 1 g of a bisstyrylanthracene derivative (BSA) represented by the following formula:

was placed as an electron transporting material. After the evacuation of the vacuum chamber to 10$^{-4}$ Pa, the crucible having Compound No. 4 therein was energized, whereby the film was formed at a deposition rate of 0.2 to 0.3 nm/sec until the film thickness became 50 nm. The crucible having BSA therein was then energized, whereby a film was formed at a deposition rate of 0.2 to 0.4 nm until the film thickness became 50 nm. The pressure of the vacuum chamber was then returned to the atmospheric pressure and a cathode was formed in a similar manner to Example 1 on the device having a composition of supporting substrate/ITO/No. 4 layer/BSA layer. The EL device so fabricated was taken out from the deposition chamber and energized as in Example 1. As a result, application of a voltage at 6 V caused an electric current of 10 mA/cm to flow and yellow luminescence having a brightness of 1000 cd/m$^2$ was obtained.

Example 7

Figure 5:
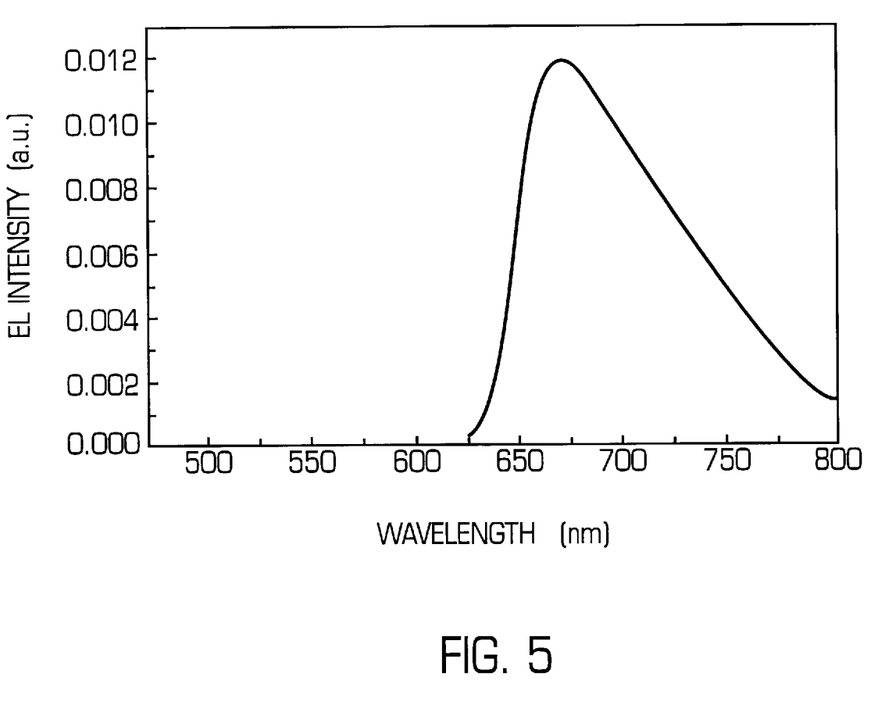
FIG. 5 is a view illustrating one example of a luminescent spectrum radiated from the EL device of the present invention.

As in Example 1, a supporting substrate was installed to a deposition chamber after cleaning. In a crucible made of high-purity graphite, 1 g of a triphenyldiamine derivative represented by the following formula:

was placed as a hole transport layer, while in another crucible, 1 g of BSA was placed as a luminescent host material. In a further crucible, 1 g of a red-emitting material (Compound No. 4) prepared in Synthesis Example was placed as a luminescent dopant material. To them, current-carrying terminals were attached, respectively. After evacuation of the vacuum chamber to $1 \times 10^{-4}$ Pa, the crucible having the triphenyldiamine derivative therein was energized and a film was formed at a deposition rate of 0.2 to 0.3 nm/sec until the film thickness became 50 nm. Then, the crucibles having BSA and Compound No. 4 therein were energized, respectively. Currents were controlled so that the deposition rate of BSA would be 0.2 to 0.3 nm/sec and that of Compound No. 4 would be 0.01 to 0.02 nm/sec. After they became stable, deposition was started simultaneously. Voltagce supply for Compound No. 4 was stopped at the time when BSA had a film thickness of 20 nm and the film formation of only BSA was continued until its film thickness became 30 nm. As in Example 1, a cathode was formed on the device so fabricated, that is, the device constructed of a supporting substrate, ITO, triphenyldiamine derivative, BSA+Compound No. 4 and BSA. The device was subjected to an electricity application test as in Example 1. As a result, when an applied voltage is 5 V, a current corresponding to current density of 10 mA/cm² flew through the device and red luminescence of 800 cd/m² was obtained (FIG. 5). The device was subjected to a driving test at an electric density of 5 mA/cm² in a nitrogen gas and a half life of brightness was measured, resulting in about 1000 hours.

Examples 8 to 12

In each of Examples 8 to 12, an EL device was fabricated in a similar manner to Example 7 except that a 8-quinolinol-aluminum complex was used as a luminescent host material. Incidentally, the device was fabricated with a weight ratio of the luminescent host material to the dopant material as in Table 3. The device was tested by applying thereto a current as in Example 1. At the same time, they were driven at a current density of 5 mA/cm2 in a nitrogen gas and the half life of brightness was observed. As a result, devices having excellent efficiency and drive life as shown in Table 3 were obtained.

Table 3

| | Concentration of Compound No. 4 (wt. %) | Current density at applied voltage of 5V (mA/cm²) | Brightness (cd/m²) | Half life (hour) |
|---|---|---|---|---|
| Example 8 | 0.001 | 10 | 1000 | 2000 |
| Example 9 | 0.01 | 10 | 1200 | 2200 |
| Example 10 | 0.1 | 10 | 1150 | 2000 |
| Example 11 | 1.0 | 9 | 980 | 1800 |
| Example 12 | 40 | 8 | 780 | 1700 |

Comparative Example

In a similar manner to each of Examples 4 to 8 except that the weight ratio of the dopant material to the luminescent host material was set at 60%, an EL device was fabricated. The device was tested by the application of current. As a result, a current corresponding to a current density of 2 mA/cm² flew through the device and red luminescence having a brightness of 10 cd/mn was observed.

What is claimed is:

1. An organic electroluminescent material comprising a coumarin derivative represented by the following formula (1):

wherein $R_1$ to $R_4$ each independently represents a hydrogen atom, a halogen atom, a substituted or unsubstituted alkyl group, a substituted or unsubstituted allkoxy group, a substituted or unsubstituted thioalkyl group, a substituted or unsubstituted aryloxy group, a substituted or unsubstituted arylthio group, a substituted or unsubstituted carbocyclic aromatic group or a substituted or unsubstituted heterocyclic aromatic group.

2. In an organic electroluminescent device having an organic functional layer, which contains at least one emitter layer, sandwiched between a pair of electrodes, the improvement wherein said organic functional layer comprises an organic electroluminescent material as claimed in claim 1.

3. An organic electroluminescent device according to claim 2, wherein said emitter layer comprises an organic electroluminescent material represented by the formula (1) in claim 1.

4. An organic electroluminescent device according to claim 3, wherein said emitter layer comprises a green-light emitting material having an electroluminescent spectrum at 500 nm to 550 nm and an organic electroluminescent material represented by the formula (1) in claim 1.

5. An organic electroluminescent device according to claim 3, wherein said emitter layer comprises a quinoline metal complex and an organic electroluminescent material represented by the formula (1) in claim 1.

6. An organic electroluminescent device according to claim 5, wherein an organic electroluminescent material represented by the formula (1) in claim 1 is contained in an amount of 0.001 to 50 wt. % relative to the quinoline metal complex.

* * * * *

UNITED STATES PATENT AND TRADEMARK OFFICE
CERTIFICATE OF CORRECTION

PATENT NO.   : 6,068,940
DATED        : May 30, 2000
INVENTOR(S)  : Taizou Tanaka It is certified that error appears in the above-identified patent and that said Letters Patent is hereby corrected as shown below:

Column 3, line 50 delete "R6" insert --$R_6$--.

Column 11, delete "formula No. 12

"

insert--formula No. 12

--

UNITED STATES PATENT AND TRADEMARK OFFICE
CERTIFICATE OF CORRECTION

PATENT NO. : 6,068,940
DATED : May 30, 2000
INVENTOR(S) : Taizou Tanaka

It is certified that error appears in the above-identified patent and that said Letters Patent is hereby corrected as shown below:

Column 18, line 65, delete "in$^2$" insert --m$^2$--.

Column 20, line 6, delete "m$^2$" insert --m$^2$--.

line 46, delete "cm" insert --cm$^2$--.

Column 21, line 13, delete "voltage" insert --Voltage--.

line 36, delete "cm2" insert --cm$^2$--.

Column 22, line 4 delete "mn" insert --m$^2$--.

Signed and Sealed this

Twenty-fourth Day of April, 2001

Attest:

NICHOLAS P. GODICI

Attesting Officer

Acting Director of the United States Patent and Trademark Office